(12) United States Patent
Clerc (10) Patent No.: US 7,564,282 B2
(45) Date of Patent: Jul. 21, 2009

(54) BISTABLE FLIP-FLOP HAVING RETENTION CIRCUIT FOR STORING STATE IN INACTIVE MODE

(75) Inventor: Sylvain Clerc, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/258,826

(22) Filed: Oct. 26, 2005

(65) Prior Publication Data

US 2006/0109040 A1 May 25, 2006

(30) Foreign Application Priority Data

Oct. 26, 2004 (FR) .................................. 04 11388

(51) Int. Cl.
*H03K 3/289* (2006.01)
(52) U.S. Cl. .................... 327/203; 327/211; 327/212; 327/214; 327/218
(58) Field of Classification Search ................ 327/199, 327/202, 203, 208–212, 214, 218
See application file for complete search history.

(56) References Cited

U.S. PATENT DOCUMENTS

| | | | | |
|---|---|---|---|---|
| 4,495,629 A | * | 1/1985 | Zasio et al. | 377/70 |
| 4,569,067 A | * | 2/1986 | Gallup | 377/79 |
| 5,689,517 A | * | 11/1997 | Ruparel | 714/731 |
| 6,242,948 B1 | | 6/2001 | Makino | |
| 6,492,854 B1 | * | 12/2002 | Ku et al. | 327/202 |
| 6,587,384 B2 | * | 7/2003 | Perner | 365/189.05 |
| 6,803,799 B1 | | 10/2004 | Churchill et al. | |
| 6,870,412 B2 | * | 3/2005 | Cho | 327/202 |
| 6,873,197 B2 | * | 3/2005 | Kanba | 327/202 |

OTHER PUBLICATIONS

Shigematsu et al., "A 1-V High-Speed MTCMOS Circuit Scheme for Power-Down Application Circuits," IEEE Journal of Solid State Circuits, vol. 32, No. 6, Jun. 1997.*
Hyo-Sig Won, et al., "An MTCMOS Design Methodology and Its Application to Mobile Computing," Proceedings of the 2003 International Symposium on Low Power Electronics and Design, ISLPED '03, Seoul, Korea, Aug. 25-27, 2003, International Symposium on Low Power Electronics and Design, New York, NY, ACM, US, Aug. 25, 2003, pp. 110-115, XP010858596, ISBN: 1-58113-682-X.
Shigematsu, S., et al., "A 1-V High-Speed MTCMOS Circuit Scheme for Power-Down Application Circuits," IEEE Journal of Solid-State Circuits, IEEE Inc., New York, US, vol. 32, No. 6, Jun. 1997, pp. 861-869, XP000723409, ISSN: 0018-9200.
Preliminary Search Report for French Application No. 0411388 dated Apr. 8, 2005.

* cited by examiner

*Primary Examiner*—Lincoln Donovan
*Assistant Examiner*—William Hernandez
(74) *Attorney, Agent, or Firm*—Lisa K. Jorgenson; Stephen Bongini; Fleit Gibbons Gutman Bongini & Bianco P.L.

(57) ABSTRACT

A bistable flip-flop device is provided that is triggered on the edges of a clock signal. The device has an active mode in which it is electrically powered and an inactive mode. The device includes a chain of inverters controlled by a clock signal, storage means for storing the state of the device in the active mode, and retention means for storing the state of the device in the inactive mode. The device includes a continuously-powered bistable structure that integrates the retention means and part of the storage means. The bistable structure includes a single isolation switch connected to the inverter chain and controlled by a standby logic signal that is representative of the active or inactive mode.

23 Claims, 6 Drawing Sheets

BISTABLE FLIP-FLOP HAVING RETENTION CIRCUIT FOR STORING STATE IN INACTIVE MODE

CROSS-REFERENCE TO RELATED APPLICATIONS

This application is based upon and claims priority from prior French Patent Application No. 04 11388, filed Oct. 26, 2004, the entire disclosure of which is herein incorporated by reference.

FIELD OF THE INVENTION

The present invention relates to bistable devices, and more specifically to bistable edge-triggered flip-flops.

BACKGROUND OF THE INVENTION

An edge-triggered flip-flop is a component frequently employed in microelectronics for storing a binary value or "state". This device is often formed by assembling two "latch" circuits together, which are referred to as master and slave. A latch circuit is a bistable structure composed of two inverters connected such that the output of the first inverter is fed back to its input via the second inverter. One of these inverters can be an inverter of the tri-state type.

The edge-triggered flip-flop has two distinct periods: a transparent period over a short time window around an edge of the clock signal; and an opaque or storage period lasting for the remainder of the time of the period, and in which the output of the flip-flop delivers the last information to pass through it during its preceding transparent state.

In the case of a flip-flop triggered on a rising edge, the first latch circuit is transparent when the clock signal is in the low state and opaque when the clock signal is in the high state. The second latch circuit is transparent when the clock signal is in the high state and opaque when the clock signal is in the low state. Thus, the resulting flip-flop is transparent during the rising edge of the clock signal.

The two latch circuits, master and slave, are connected in series via a switch. The switch can be conventionally formed in two ways: an inverter of the tri-state type composed of four transistors in series, two p-MOS transistors and two n-MOS transistors; or a switch of the pass-gate type composed of two transistors in parallel, one p-MOS transistor and one n-MOS transistor.

An edge-triggered flip-flop also comprises two feedback loops, where the outputs of the master and slave inverters are fed back to their respective inputs, and two power supplies, one main power supply being discontinuous and the other continuous. The feedback loops allow the states to be stored during a first mode, or active mode, in other words when the inverters are powered. In addition, the flip-flop comprises a retention means that allows the state of the flip-flop input data to be stored in an "inactive" mode, in other words when the main power supply is interrupted.

A first example of this type of flip-flop is the MTCMOS circuit described in the article "MTCMOS with outer feedback flip-flops," IEEE 2003 (Mircea R. Stan et al.).

A second example relates to flip-flops known as "balloon storage loop flip-flops" described in the article "A 1V high-speed MTCMOS circuit scheme for power-down application circuits," IEEE Journal of Solid State Circuits, Vol. 32, No. 6, June 1997 (Satoshi Shigematsu).

These existing devices are based on either the duplication of a latch circuit within the flip-flop, or the re-use of certain transistors in the flip-flop that are associated with switches, so as to construct an externally coupled inverter capable of storing the state. These devices require a large number of components and hence are relatively costly to produce.

SUMMARY OF THE INVENTION

It is an object of the present invention to overcome these drawbacks, and to provide an edge-triggered flip-flop that allows the state to be stored in an active mode and in an inactive mode, while at the same time having a limited number of transistors.

Another object of the present invention is to avoid the write conflict that can occur when the main power supply to the flip-flop is turned on or turned off.

One embodiment of the present invention provides a bistable flip-flop device that has an active mode in which the device is electrically powered and an inactive mode. The flip-flop device includes a chain of inverters controlled by a clock signal, storage means for storing a state of the flip-flop device in the active mode, and retention means for storing the state of the flip-flop device in the inactive mode. The flip-flop device comprises a continuously powered bistable structure that integrates the retention means and a part of the storage means. The bistable structure comprises a single isolation switch that is connected to the inverter chain and controlled by a standby logic signal that is representative of whether the flip-flop device is in the active mode or the inactive mode.

Another embodiment of the present invention provides an integrated circuit that includes at least one such bistable flip-flop device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

One embodiment of the present invention provides a bistable device of the flip-flop type that is triggered on the edges of a clock signal. The flip-flop has a first mode, for example an active mode in which it is electrically powered, and a second mode, for example an inactive mode. The flip-flop comprises a chain of inverters controlled by the clock signal, storage means capable of storing the state of the flip-flop in the first mode, and retention means capable of storing the state of the flip-flop in the second mode.

In this embodiment of the present invention, the flip-flop comprises a continuously-powered bistable structure integrating the retention means together with a part of the storage means. The bistable structure comprises a single isolation switch connected to the inverter chain and controlled by a logic signal, for example a standby logic signal, that is representative of the first mode or the second mode.

In other words, the device according to this embodiment of the present invention comprises one means (the bistable structure) that functionally and materially forms both the retention means and a part of the storage means. This bistable structure is capable of storing a state when the main power is turned off, which also has the advantage of being able to operate as a feedback loop when the power is on. Hence, it allows the duplication of the feedback loops to be avoided.

Another embodiment of the present invention provides a bistable structure that comprises a first inverter whose output is fed back to its input via a second inverter of the tri-state type comprising four transistors in series, two of which are controlled by the clock signal. In addition, the bistable structure comprises two additional transistors respectively connected in parallel with the two controlled transistors of the inverter of the tri-state type, with these two additional transistors being themselves controlled by the standby signal.

The use of an inverter of the tri-state type has the advantage of limiting the number of transistors employed, given that the bistable structure is only connected to the inverter chain by a single switch.

Moreover, the use of an inverter of the tri-state type has the advantage of allowing a write conflict to be avoided when the value to be stored changes state during the active mode.

The isolation switch can be connected to the node that is common to the two uncontrolled transistors of the inverter of the tri-state type.

Alternatively, the isolation switch can be connected to the node that is common to the two controlled transistors of the inverter of the tri-state type.

Yet another embodiment of the present invention provides a bistable structure that comprises a main inverter whose input is connected to the isolation switch and whose output is fed back to its input via a secondary inverter. In addition, the W/L ratio of the transistors of the secondary inverter is at least three times smaller than the W/L ratio of the transistors of the first inverter of the inverter chain (where W denotes the width of the channel of a transistor and L its length).

Such a choice of the dimensions of the transistors of the bistable structure inverters allows a write conflict to be avoided when the value to be stored changes state, while at the same time keeping only a single switch between the bistable structure and the inverter chain.

Preferably, the device comprises a recall means that is capable of forcing the node that is common to the bistable structure and to the inverter chain into the high state when the standby signal is in the high state.

Such a recall means allows the common node to be maintained in a known state during the transient phases. It thus allows an over-consumption of power to be avoided during these phases of transition from the active state to the passive state and vice versa.

In one embodiment, the recall means is a transistor.

In some embodiments, the other part of the storage means comprises a feedback inverter connected in series with a switch that is controlled by the clock signal.

According to one embodiment of the present invention, the device is fabricated in the form of an integrated circuit.

Exemplary embodiments of the present invention will now be described in detail with reference to FIGS. 1-7.

Figure 1:
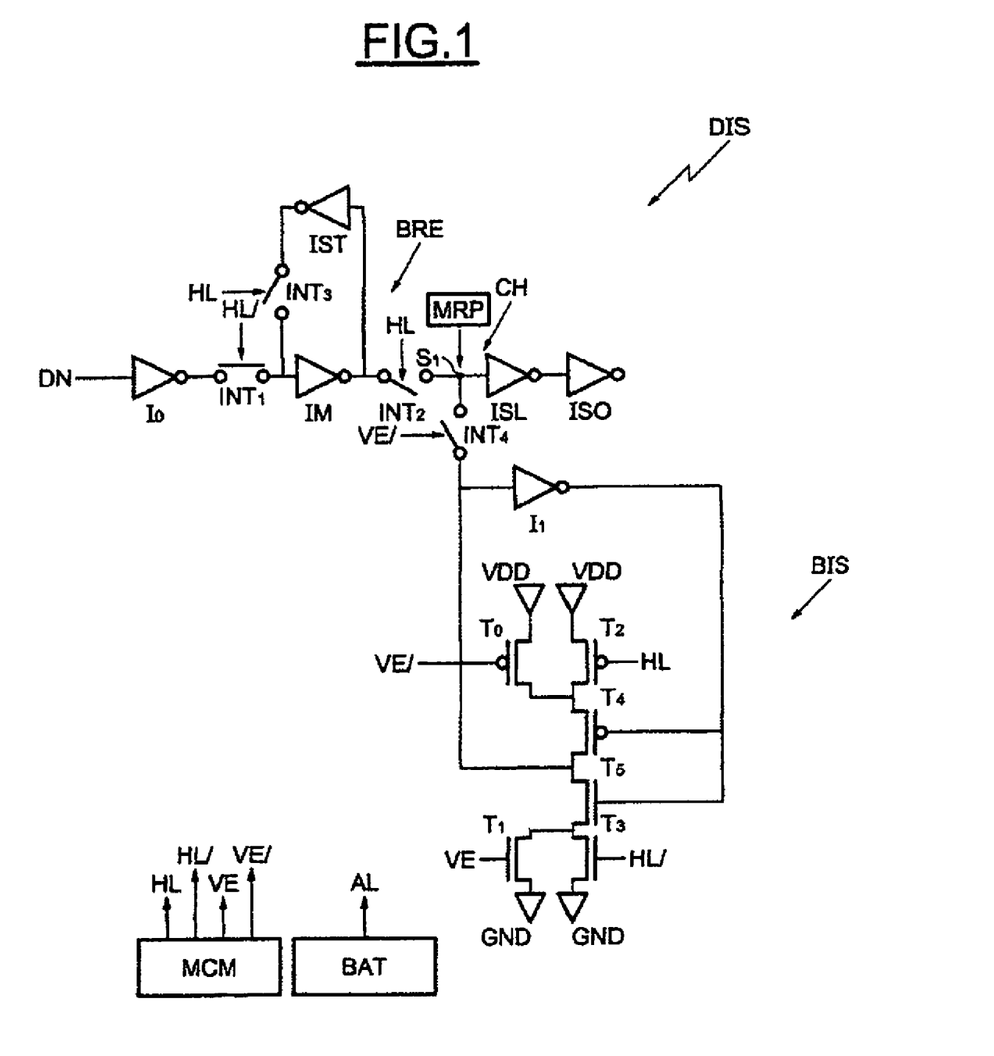
FIG. 1 shows an edge-triggered flip-flop device according to a first embodiment of the present invention.

FIG. 1 illustrates an edge-triggered flip-flop device DIS according to one embodiment of the present invention. The device DIS comprises a chain of inverters CH. The inverter chain CH comprises an input inverter $I_0$ that receives data DN at its input. The chain CH also comprises a second inverter IM that is known as the master inverter. The second inverter IM is connected to the input inverter via a switch $INT_1$ that is controlled by an inverted clock signal HL/.

The inverter chain CH also comprises another inverter ISL that is known as the slave inverter. The slave inverter ISL is connected to the master inverter IM via a second switch $INT_2$ that is controlled by the clock signal HL. In this exemplary embodiment, a final output inverter ISO terminates the chain of inverters CH.

The clock signal HL and inverted clock signal HL/ are generated by a control circuit MCM.

The device also comprises a feedback loop BRE via which the output of the master inverter IM is fed back to its input.

The feedback loop BRE comprises an inverter IST that is connected to the input of the master inverter IM via a switch $INT_3$ that is controlled by the clock signal HL.

All of the inverters of the chain of inverters CH, together with the inverter IST of the feedback loop BRE, are powered by a power supply AL that is delivered by a battery BAT. The power supply voltage AL is discontinuous. The power supply AL operates during a first mode, which is known as "active mode", and is turned off during a second mode, which is known as "inactive mode". When the power is turned on, the feedback loop BRE allows the state to be stored. Thus, for the embodiment of FIG. 1, when the clock signal is in the high state, the switches $INT_2$ and $INT_3$ are closed. The data DN transmitted to the input of the inverter ISL is then stored in the loop BRE until the next clock pulse HL.

The device DIS also comprises a bistable structure BIS that is connected to the chain of inverters CH at a node S1, via an isolation switch $INT_4$ that is controlled by a logic signal VE/. The signal VE/ is the inverse of a logic signal that is known as the "standby signal" VE that is generated by the control circuit MCM. The standby logic signal VE is therefore representative of the state of the device: "inactive" when the signal VE is at "1" and "active" when it is at "0".

The bistable structure BIS comprises an inverter $I_1$, whose output is fed back to its input via an inverter of the tri-state type. The inverter of the tri-state type is formed from four MOS transistors $T_2$, $T_4$, $T_3$, and $T_5$ that are connected in series between a continuous voltage VDD and ground GND.

The transistors $T_2$ and $T_4$ are PMOS transistors. The transistor $T_2$ is connected between the power supply voltage VDD and the source of the transistor $T_4$. Additionally, it is controlled on its gate by the clock signal HL. The transistor $T_4$ is connected between the transistor $T_2$ and the source of the transistor $T_5$, and its gate is connected to the output of the inverter $I_1$. The transistors $T_5$ and $T_3$ are NMOS transistors. The transistor $T_5$ is connected between the transistor $T_4$ and the source of the transistor $T_3$, and its gate is connected to the output of the inverter $I_1$. The transistor $T_3$ is connected to the transistor $T_5$ and to ground, and its gate is controlled by the inverted clock signal HL/. The node that is common to the transistors $T_4$ and $T_5$ is connected to the isolation switch $INT_4$ and to the input of the inverter $I_1$.

A tri-state inverter delivers at its output the data that it receives at its input when the clock signal is in the high state. When the clock signal is low, the output of the tri-state inverter is in an intermediate state.

Two additional transistors $T_0$ and $T_1$, are respectively connected in parallel with the transistors $T_2$ and $T_3$. The transistor $T_0$ is a PMOS transistor that is connected between the supply voltage VDD and the drain of the transistor $T_2$. It is controlled on its gate by the inverted standby signal VE/. The transistor $T_1$ is an NMOS transistor that is connected between the source of the transistor $T_3$ and ground GND. It is controlled on its gate by the standby signal VE.

The transistors and inverters of the bistable structure BIS are continuously powered by the supply voltage VDD.

The bistable structure BIS acts as a feedback loop when the power supply voltage AL is operative, and as a retention loop when the power supply AL is interrupted. By not duplicating the feedback loop for the slave inverter and for the master inverter, random write phases during the operational transitions of the power supply AL are limited.

Figure 2:
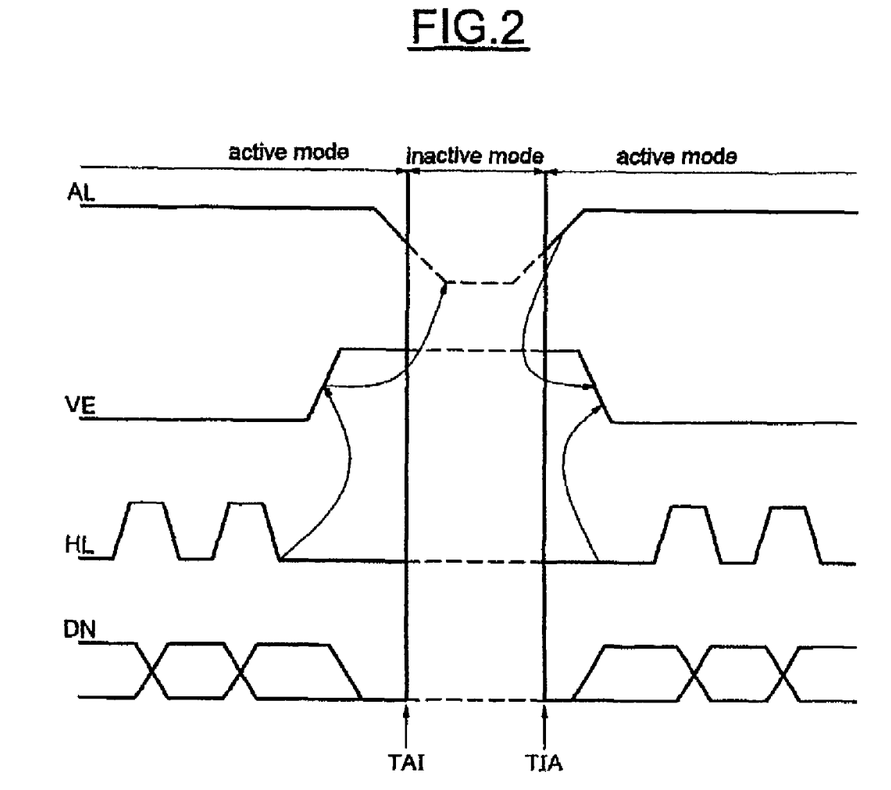
FIG. 2 shows a timing diagram of various signals during the operation of an edge-triggered flip-flop device according to one embodiment of the present invention.
Figure 3:
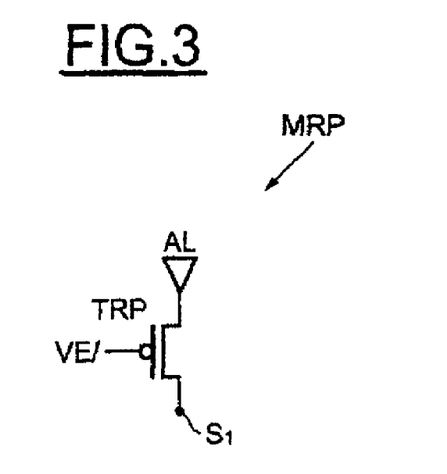
FIG. 3 illustrates in more detail an exemplary embodiment of one block of the edge-triggered flip-flop device of FIG. 1.

The timing diagram of FIG. 2 provides a more precise description of the operation of the flip-flop device illustrated in FIG. 1.

The first phase corresponds to the active mode. The voltage of the power supply AL to the inverters of the inverter chain and the feedback loop is then in the high state. The standby signal VE is in the low state. The operation of the clock signal HL determines the timing of the transmission of the data DN.

When the device is in active mode, the isolation switch $INT_4$ is therefore conducting. Accordingly, the flip-flop operates with two feedback loops, the first feedback loop being the feedback loop BRE and the second feedback loop being formed by the bistable structure BIS. Thus, the state is stored in the bistable structure BIS when the switches $INT_1$ and $INT_2$ are respectively closed and open, and in the feedback loop BRE when the switches $INT_1$ and $INT_2$ are respectively open and closed.

When the power supply AL is interrupted, the device goes into inactive mode. When the device is in this mode, the standby signal VE is in the high state. The clock signal HL and the data signal DN delivered at the input are inactive. The isolation switch $INT_4$ is open, isolating the bistable structure BIS; the state is therefore stored in the bistable structure BIS which thus operates as a retention loop.

Indeed, since the isolation switch $INT_4$ is open, the power supply AL is off, the clock HL is inactive, and the transistors $T_2$ and $T_3$ are turned off, then the additional transistors $T_0$ and $T_1$ force the feedback with the inverter $I_1$, since the assembly $T_0$, $T_4$, $T_5$, and $T_1$ operates as an inverter.

When the power supply voltage AL goes high, the standby signal VE will then go low, and the device will then be in the active mode.

The passage from the active mode to the inactive mode or from the inactive mode to the active mode defines the transient periods TAI and TIA, respectively.

During a TAI transition, the power supply AL goes from the high state to the low state and the clock signal HL is maintained in the low state. The standby signal is held in the high state in order to keep the isolation switch $INT_4$ in the open position. Thus, the state of the flip-flop is stored in the bistable structure BIS that operates as a retention loop. All of the other transistors of the device DIS switch from the high state to the low state.

During a TIA transition, the power supply goes from the low state to the high state and the clock signal is maintained in the low state. The standby signal is initially held in the high state, so as not to lose the state value. All of the other transistors of the device DIS switch from the low state to the high state. When the power supply AL is re-established, the standby signal VE goes low. The state of the flip-flop DIS is then restored at S1 and the clock HL can be reactivated.

Thus, the TAI and TIA transitions are easily controlled and random write phases avoided by using the standby signal VE. In the conventional devices (for example for the "balloon retention loop flip-flops"), two clocks without overlap phase were necessary.

It is preferable that the node S1 not be in a floating state owing to the use of an inverter of the tri-state type within the bistable structure BIS. Accordingly, the device DIS preferably also comprises a recall means MRP, for example a transistor, which can for example be a low-power PMOS transistor as illustrated in the exemplary embodiment of FIG. 3. As shown, the recall means MRP comprises a PMOS transistor TRP whose source is powered by the power supply AL. Its drain is connected to the node S1 and its gate is controlled by the complement of the standby signal VE/.

Figure 4:
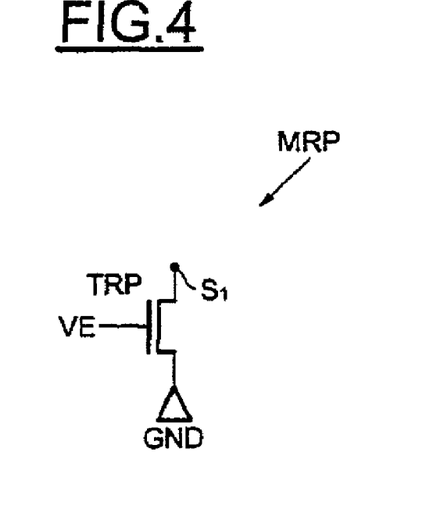
FIG. 4 illustrates another exemplary embodiment of the block shown in FIG. 3.

FIG. 4 shows another exemplary embodiment of the recall means MRP which is now formed by a low-power NMOS transistor TRP. Its source is powered by a connection to ground GND. Its drain is connected to the node S1 and its gate is controlled by the standby signal VE.

This recall transistor will force the node S1 into the high state during these transient phases TAI and TIA, so as to avoid an over-consumption of power in the slave inverter ISL.

Figure 5:
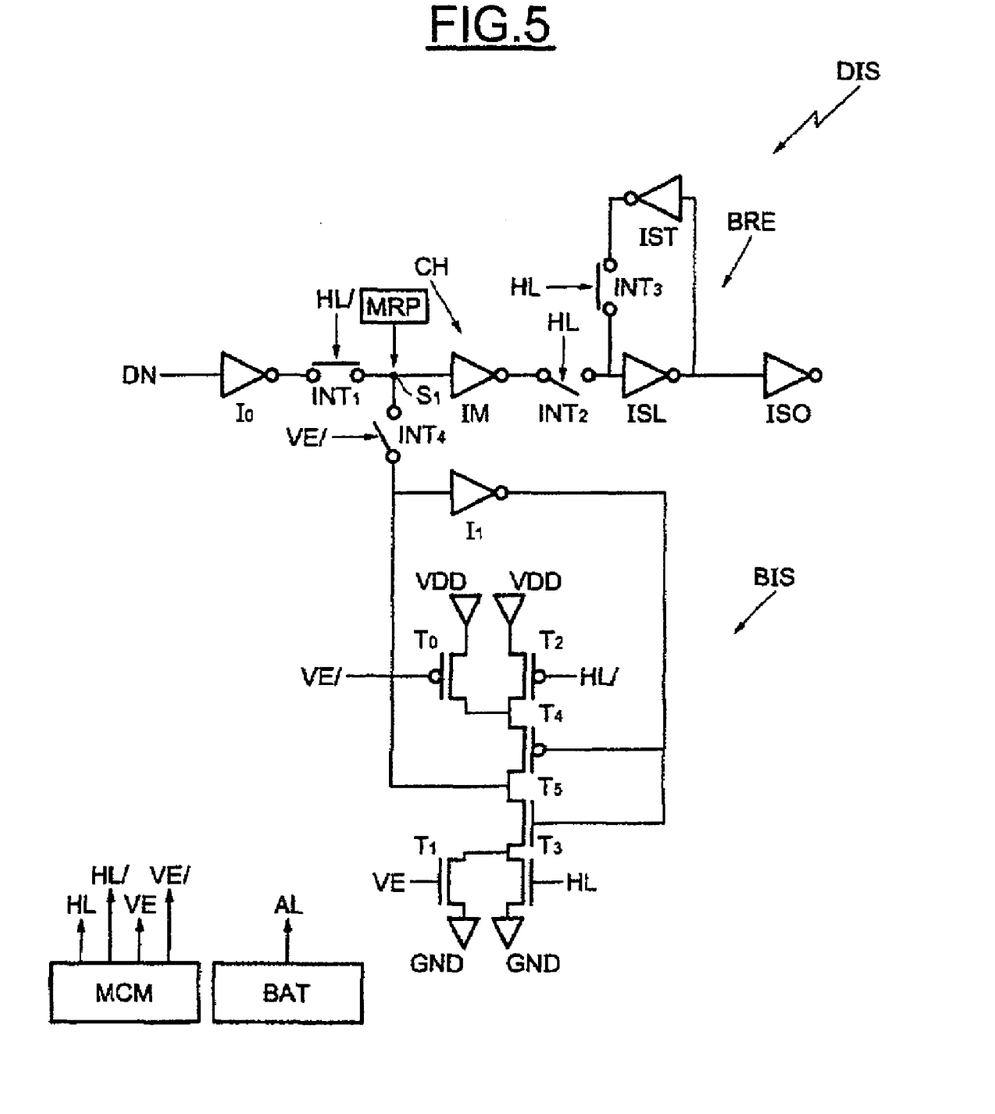
FIG. 5 shows a flip-flop device according to another embodiment of the present invention.

FIG. 5 shows a flip-flop device DIS according to another embodiment of the present invention, which is a variant of the embodiment shown in FIG. 1. In FIG. 1 the bistable structure BIS is connected to the input of the slave inverter ISL. In the variant of FIG. 4 the bistable structure BIS is moved to the input of the master inverter IM. The feedback loop BRE now feeds back the output of the slave inverter ISL to its input. Furthermore, the transistors $T_2$ and $T_3$ of the bistable structure BIS are respectively controlled by the inverted clock signal HL/ and the clock signal HL.

The operation of this variant can be deduced from the timing diagram of FIG. 2, by switching the holding level of the clock signal HL to "1" during the transitions.

Figure 6:
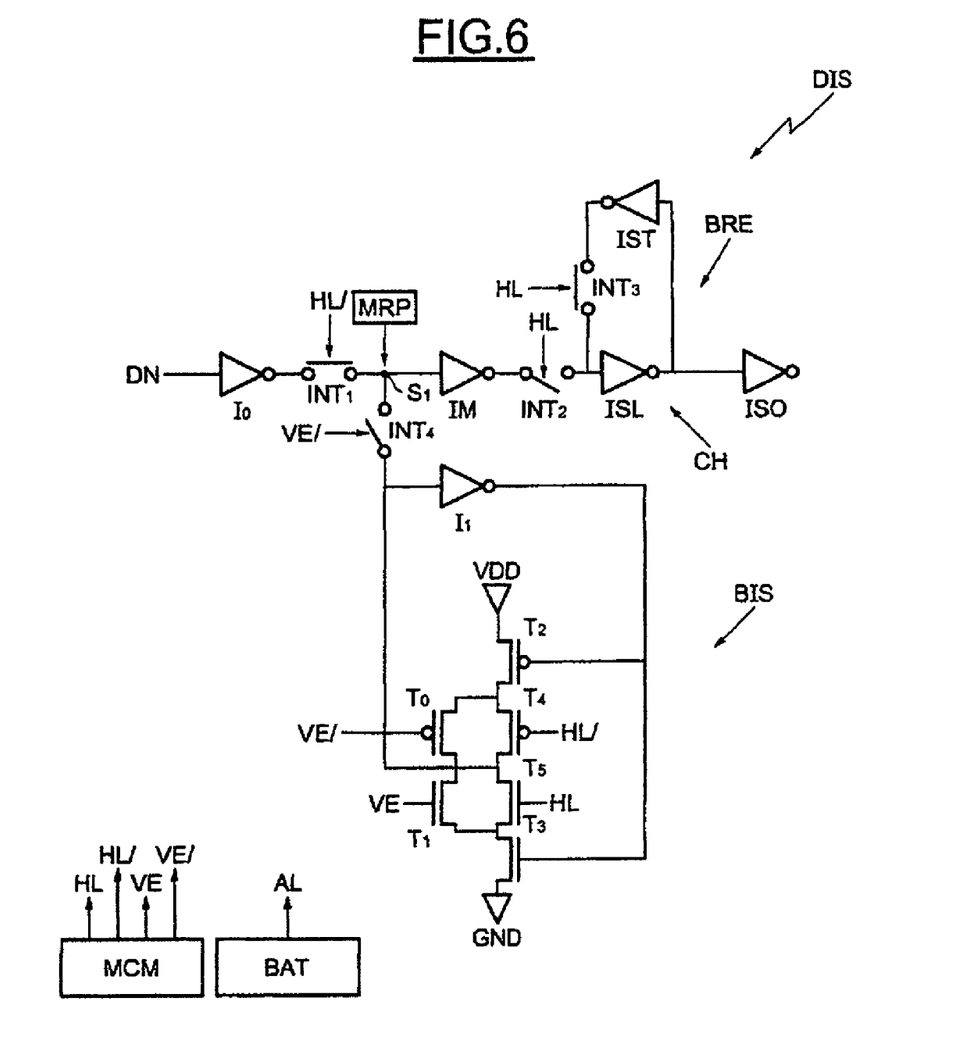
FIG. 6 shows a variant of the embodiment shown in FIG. 5.

FIG. 6 shows a variant of the embodiment shown in FIG. 5. In this variant, the structure of the inverter of the tri-state type in the bistable structure BIS has been modified. The output of the inverter $I_1$, is connected to the gates of the transistors $T_2$ and $T_3$. The transistor $T_4$ is controlled on its gate by the inverted clock signal HL/. The transistor $T_5$ is controlled on its gate by the clock signal HL. The additional transistor $T_0$ is connected between the source of the transistor $T_4$ and the source of the transistor $T_5$, and is controlled on its gate by the inverted standby signal VE/. The additional transistor $T_1$ is connected between the source of the transistor $T_5$ and the source of the transistor $T_3$, and is controlled on its gate by the standby signal VE.

Figure 7:
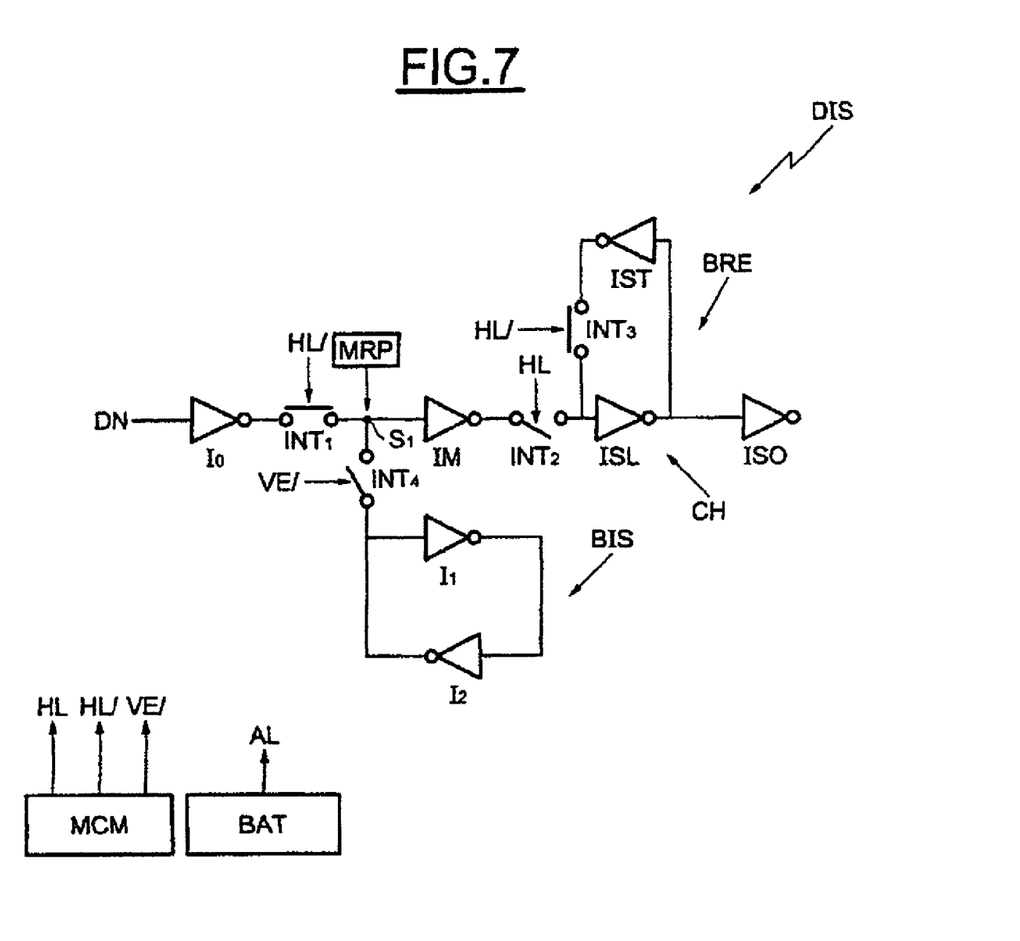
FIG. 7 shows a flip-flop device according to yet another embodiment of the present invention.

FIG. 7 shoes an edge-triggered flip-flop device according to yet another embodiment of the present invention. In this embodiment, the bistable structure BIS comprises a main inverter $I_1$ whose input is connected to the isolation switch $INT_4$ and whose output is fed back to its input via a secondary inverter $I_2$. In this embodiment, the write conflict is pre-empted so that the conduction force of the inverter $I_0$ is higher than that of the inverter $I_2$ so as to force the writing process. The conduction force of an inverter is given by the saturation current that varies linearly as a function of the W/L ratio, where W is the width of the transistor channel and L its length.

The W/L ratio of the transistors of the secondary inverter $I_2$ can for example be three times smaller than the W/L ratio of the transistors of the inverter $I_0$.

The present invention is particularly suited to, but is not limited to, flip-flops of the master-slave type.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed:

1. A bi-stable flip-flop device having an active mode in which the device is electrically powered and an inactive mode, the flip-flop device comprising:
    a chain of inverters controlled by a clock signal, the chain of inverters including a master inverter and a slave inverter;
    storage means for storing a state of the flip-flop device in the active mode; and
    retention means for storing the state of the flip-flop device in the inactive mode,
    wherein the flip-flop device comprises a continuously powered bi-stable structure that integrates the retention means and a part of the storage means, the bi-stable structure comprising a single isolation switch that is connected to the inverter chain and controlled by a standby logic signal that is representative of whether the flip-flop device is in the active mode or the inactive mode,
    the single isolation switch is directly connected to the input of the master inverter or the input of the slave inverter, and
    in the active mode the bi-stable structure operates as a feedback loop.

2. The flip-flop device according to claim 1, wherein the bi-stable structure comprises a tri-state inverter comprising four transistors in series, two of the four transistors being controlled by the clock signal.

3. The flip-flop device according to claim 2,
    wherein the bi-stable structure further comprises:
        a first inverter whose output is fed back to its input via the tri-state inverter; and
        two additional transistors each connected in parallel with one of the two transistors of the tri-state inverter that are controlled by the clock signal, the two additional transistors being controlled by the standby logic signal, and
    the isolation switch is also connected to a node that is common to the two transistors of the tri-state inverter that are not controlled by the clock signal.

4. The flip-flop device according to claim 2,
    wherein the bi-stable structure further comprises:
        a first inverter whose output is fed back to its input via the tri-state inverter; and
        two additional transistors each connected in parallel with one of the two transistors of the tri-state inverter that are controlled by the clock signal, the two additional transistors being controlled by the standby logic signal, and
    the isolation switch is also connected to a node that is common to the two transistors of the tri-state inverter that are controlled by the clock signal.

5. The flip-flop device according to claim 1, wherein the bi-stable structure comprises:
    a secondary inverter; and
    a main inverter whose input is connected to the isolation switch and whose output is fed back to its input via the secondary inverter,
    wherein the W/L ratio of transistors of the secondary inverter is at least three times smaller than the W/L ratio of transistors of a first inverter of the inverter chain.

6. The flip-flop device according to claim 1, further comprising a recall means for forcing a node that is common to the bi-stable structure and the inverter chain into the high state when the standby logic signal is in the high state.

7. The flip-flop device according to claim 6, wherein the recall means consists of a transistor.

8. The flip-flop device according to claim 1,
    wherein another part of the storage means comprises a feedback inverter that is connected in series with another switch, which is controlled by the clock signal, and
    the other switch is directly connected to the input of the master inverter or the input of the slave inverter.

9. An integrated circuit including at least one bi-stable flip-flop device having an active mode in which the device is electrically powered and an inactive mode, the flip-flop device comprising:
    a chain of inverters controlled by a clock signal, the chain of inverters including a master inverter and a slave inverter;
    storage means for storing a state of the flip-flop device in the active mode; and
    retention means for storing the state of the flip-flop device in the inactive mode,
    wherein the flip-flop device comprises a continuously powered bi-stable structure that integrates the retention means and a part of the storage means, the bi-stable structure comprising a single isolation switch that is connected to the inverter chain and controlled by a standby logic signal that is representative of whether the flip-flop device is in the active mode or the inactive mode,
    the single isolation switch is directly connected to the input of the master inverter or the input of the slave inverter, and
    in the active mode the bi-stable structure operates as a feedback loop.

10. The integrated circuit according to claim 9, wherein the bi-stable structure of the flip-flop device comprises:
    a tri-state inverter comprising four transistors in series, two of the four transistors being controlled by the clock signal;
    a first inverter whose output is fed back to its input via the tri-state inverter; and
    two additional transistors each connected in parallel with one of the two transistors of the tri-state inverter that are controlled by the clock signal, the two additional transistors being controlled by the standby logic signal.

11. The integrated circuit according to claim 10, wherein the isolation switch of the flip-flop device is also connected to a node that is common to the two transistors of the tri-state inverter that are not controlled by the clock signal, or a node that is common to the two transistors of the tri-state inverter that are controlled by the clock signal.

12. The integrated circuit according to claim 9, wherein the bi-stable structure of the flip-flop device comprises:
- a secondary inverter; and
- a main inverter whose input is connected to the isolation switch and whose output is fed back to its input via the secondary inverter,
- wherein the W/L ratio of transistors of the secondary inverter is at least three times smaller than the W/L ratio of transistors of a first inverter of the inverter chain.

13. The integrated circuit according to claim 9, wherein the flip-flop device further comprises a recall means for forcing a node that is common to the bi-stable structure and the inverter chain into the high state when the standby logic signal is in the high state.

14. The integrated circuit according to claim 9,
- wherein another part of the storage means of the flip-flop device comprises a feedback inverter that is connected in series with another switch, which is controlled by the clock signal and
- the other switch is directly connected to the input of the master inverter or the input of the slave inverter.

15. A bi-stable flip-flop device having an active mode in which the device is electrically powered and an inactive mode, the flip-flop device comprising:
- a chain of inverters controlled by a clock signal, the chain of inverters including a master inverter and a slave inverter;
- a storage circuit storing a state of the flip-flop device in the active mode; and
- a retention circuit storing the state of the flip-flop device in the inactive mode,
- wherein the flip-flop device comprises a continuously powered bi-stable structure that forms both the retention circuit and a part of the storage circuit, the bi-stable structure comprising a single isolation switch that is connected to the inverter chain and controlled by a standby logic signal that is representative of whether the flip-flop device is in the active mode or the inactive mode,
- the single isolation switch is directly connected to the input of the master inverter or the input of the slave inverter, and
- in the active mode the bi-stable structure operates as a feedback loop.

16. The flip-flop device according to claim 15, wherein the bi-stable structure comprises:
- a secondary inverter; and
- a main inverter whose input is connected to the isolation switch and whose output is fed back to its input via the secondary inverter,
- wherein the W/L ratio of transistors of the secondary inverter is at least three times smaller than the W/L ratio of transistors of a first inverter of the inverter chain.

17. The flip-flop device according to claim 15,
- wherein another part of the storage circuit comprises a feedback inverter that is connected in series with another switch, which is controlled by the clock signal, and
- the other switch is directly connected to the input of the master inverter or the input of the slave inverter.

18. The flip-flop device according to claim 15, wherein in the inactive mode the bi-stable structure operates as a retention loop that stores the state of the flip-flop device.

19. A bi-stable flip-flop device having an active mode in which the device is electrically powered and an inactive mode, the flip-flop device comprising:
- a chain of inverters controlled by a clock signal;
- a storage circuit storing a state of the flip-flop device in the active mode; and
- a retention circuit storing the state of the flip-flop device in the inactive mode,
- wherein the flip-flop device comprises a continuously powered bi-stable structure that forms both the retention circuit and a part of the storage circuit, the bi-stable structure comprising a single isolation switch that is connected to the inverter chain and controlled by a standby logic signal that is representative of whether the flip-flop device is in the active mode or the inactive mode, and
- the bi-stable structure comprises:
    - a tri-state inverter comprising four transistors in series, two of the four transistors being controlled by the clock signal;
    - a first inverter whose output is fed back to its input via the tri-state inverter; and
    - two additional transistors each connected in parallel with one of the two transistors of the tri-state inverter that are controlled by the clock signal, the two additional transistors being controlled by the standby logic signal.

20. The flip-flop device according to claim 19, wherein the isolation switch is also connected to a node that is common to the two transistors of the tri-state inverter that are not controlled by the clock signal, or a node that is common to the two transistors of the tri-state inverter that are controlled by the clock signal.

21. A bi-stable flip-flop device having an active mode in which the device is electrically powered and an inactive mode, the flip-flop device comprising:
- a chain of inverters controlled by a clock signal;
- a storage circuit storing a state of the flip-flop device in the active mode; and
- a retention circuit storing the state of the flip-flop device in the inactive mode,
- wherein the flip-flop device comprises a continuously powered bi-stable structure that forms both the retention circuit and a part of the storage circuit, the bi-stable structure comprising a single isolation switch that is connected to the inverter chain and controlled by a standby logic signal that is representative of whether the flip-flop device is in the active mode or the inactive mode, and
- the flip-flop device further comprises a recall circuit forcing a node that is common to the bi-stable structure and the inverter chain into the high state when the standby logic signal is in the high state.

22. A bi-stable flip-flop device having an active mode in which the device is electrically powered and an inactive mode, the flip-flop device comprising:
- a chain of inverters controlled by a clock signal;
- a storage circuit storing a state of the flip-flop device in the active mode; and
- a retention circuit storing the state of the flip-flop device in the inactive mode,
- wherein the flip-flop device comprises a continuously powered bi-stable structure that forms both the retention circuit and a part of the storage circuit, the bi-stable structure comprising a single isolation switch that is connected to the inverter chain and controlled by a standby logic signal that is representative of whether the flip-flop device is in the active mode or the inactive mode, and the isolation switch of the bi-stable structure is closed in the active mode.

23. A bi-stable flip-flop device having an active mode in which the device is electrically powered and an inactive mode, the flip-flop device comprising:

a chain of inverters controlled by a clock signal;

a storage circuit storing a state of the flip-flop device in the active mode; and a retention circuit storing the state of the flip-flop device in the inactive mode, wherein the flip-flop device comprises a continuously powered bi-stable structure that forms both the retention circuit and a part of the storage circuit, the bi-stable structure comprising a single isolation switch that is connected to the inverter chain and controlled by a standby logic signal that is representative of whether the flip-flop device is in the active mode or the inactive mode, the bi-stable structure is directly connected to the chain of inverters through the isolation switch of the bi-stable structure, and in the inactive mode the isolation switch isolates the bi-stable structure from the chain of inverters.

* * * * *